(12) United States Patent
Li et al.

(10) Patent No.: US 7,989,076 B2
(45) Date of Patent: Aug. 2, 2011

(54) ORGANIC-INORGANIC NANOCOMPOSITE MATERIALS AND METHODS OF MAKING AND USING THE SAME

(75) Inventors: Hong Li, Sewickley, PA (US); Robert A. Montague, Shelby, NC (US); Cheryl A. Richards, Monroeville, PA (US); Nikita Sergeevitch Shelekhov, St. Petersburg (RU); Natalia Aleksandrovna Kazachenok, St. Petersburg (RU)

(73) Assignee: PPG Industries Ohio, Inc., Cleveland, OH (US)

( * ) Notice: Subject to any disclaimer, the term of this patent is extended or adjusted under 35 U.S.C. 154(b) by 0 days.

(21) Appl. No.: 11/986,313

(22) Filed: Nov. 20, 2007

(65) Prior Publication Data
US 2008/0139720 A1      Jun. 12, 2008

Related U.S. Application Data

(60) Provisional application No. 60/866,497, filed on Nov. 20, 2006.

(51) Int. Cl.
*C08K 3/22* (2006.01)
*C08K 5/057* (2006.01)
*C08K 9/04* (2006.01)
*C09C 3/08* (2006.01)

(52) U.S. Cl. ............................ 428/461; 428/457; 526/89
(58) Field of Classification Search .................. 428/461, 428/457; 526/89
See application file for complete search history.

(56) References Cited

U.S. PATENT DOCUMENTS

| | | | |
|---|---|---|---|
| 4,731,264 A | 3/1988 | Lin et al. | |
| 5,115,023 A | 5/1992 | Basil et al. | |
| 5,231,156 A | 7/1993 | Lin | |
| 5,254,638 A | 10/1993 | Novak et al. | |
| 6,180,248 B1 | 1/2001 | Basil et al. | |
| 6,419,989 B1 | 7/2002 | Betz et al. | |
| 2005/0106400 A1* | 5/2005 | Kuramoto et al. | 428/447 |
| 2005/0191505 A1* | 9/2005 | Akarsu et al. | 428/469 |
| 2006/0182942 A1 | 8/2006 | Valle et al. | |

FOREIGN PATENT DOCUMENTS

| | | | |
|---|---|---|---|
| JP | 08 157735 A | | 6/1996 |
| JP | 08157735 A | * | 6/1996 |

OTHER PUBLICATIONS

Kickelbick [Concepts for the incorporation of inorganic building blocks into organic polymers on a nanoscale—Progress in Polymer Science, 28 (2003) pp. 83-114].*
C.J. Brinker and G.W. Scherer, Sol-Gel Science, The Physics and Chemistry of Sol-Gel Processing, Academic Press, 1990.
E.J.A. Pope and J.D. MacKenzie, *Journal of Non-Crystalline Solids* 87 (1986) 198-198.
V. Bekiari and P. Lianos, *Langmuir*, ACS Journal of Surfaces and Colloids, Jun. 23, 1998, vol. 14, No. 13, 3 pages.
E. Stathatos, P. Lianos, U. Lavrencic-Strangar and B. Orel, *Advanced Materials*, 2002, 14, No. 5, Mar. 4, 4 pages.
M. Fujiwara, H. Wessel, H.S. Park, and H.W. Roesky, *Chem. Mater.* 2002, 14, pp. 4975-4981.
G.S. Grader, G.E. Shter, D.Adnir, H. Frenkel, D. Sclar and A. Dolev, Modification of Non-Hydrollytic Sol-Gel Derived Alumina by Solvent Treatments, *Journal of Sol-Gel Science and Technology* 21, 2001, pp. 157-165.
P. Hajji, L. David, J.F. Gerard, J.P. Pascault, and G. Vigier, Synthesis, Structure, and Morphology of Polymer-Silica Hybrid Nanocomposites Based on Hydroxyethyl Methacrylate, *Journal of Polymer Science: Part B: Polymer Physics*, vol. 37, 1999, pp. 3172-3187.
J.E. Mark, C.Y-C Lee, and P.A. Bianconi, Hybrid Organic-Inorganic Composites, ACS Symposium Series 585, American Chemical Society 1995, pp. 163-180.
Long-Hua Lee and Wen-Chang Chen, High-Refractive-Index Thin Films Prepared from Trialkoxysilane-Capped Poly(methylmethacrylate)—Titania Materials, *Chem. Mater.* 2001, 13, pp. 1137-1142.
W. Que, Q.Y. Zhang, Y.C. Chan, and C.H. Kam, Sol-gel derived hard optical coatings via organic/inorganic composites, *Composites Science and Technology* 63 (2003) pp. 347-351.
M. Acciarra, C. Canevali, C.M. Mari, M. Mattoni, R. Ruffo, R. Scotti, and F. Morazzoni, Nanocrystalline $SnO_2$-Based Thin Films Obtained by Sol-Gel Route: A Morphological and Structural Investigation; *Chem. Mater*, 2003, 15, pp. 2646-2650.
R.L. Brutchey, J.E. Goldberger, T.S. Koffas, and T.D. Tilley, Nonaqueous, Molecular Precursor Route to Hybrid Inorganic/Organic Zirconia-Silica Materials Containing Covalently Linked Organic Bridges; *Chem. Mater*, 2003, 15, pp. 1040-1046.
F. Touati, N. Gharbi and H. Zarrouk, Synthesis of New Hybrid Organic-Inorganic Alumina Gels by the Sol-Gel Method; *Journal of Sol-Gel Science and Technology* 8, 1997, pp. 595-598.
Wei, Y., et al., Synthesis of polystyrene-silica hybrid mesoporous materials via the nonsurfactant-templated sol-gel process, *J. Mater. Chem*, 2000, 10, pp. 2490-2494.
Chujo J. et al., Macromolecules: Synthesis, Order and Advanced Properties, *Advances in Polymer Science*, vol. 100, 1992, pp. 11-29.
T. Saegusa and Y. Chujo, Organic-Inorganic Polymer Hybrids; *Makromol. Chem., Macromol. Symp.* 64, 1992, pp. 1-9.
C. Sanchez, B. Lebeau, F. Chaput and J.P. Boilot, Optical Properties of Functional Hybrid Organic-Inorganic Nanocomposites, *Advanced Materials*, 2003, 15, No. 23, pp. 1969-1994.

(Continued)

*Primary Examiner* — Kelechi C Egwim
(74) *Attorney, Agent, or Firm* — Andrew C. Siminerio

(57) ABSTRACT

The present invention relates to materials comprising organic-inorganic polymeric networks. In some embodiments, the present invention provides an organic-inorganic composite material comprising an inorganic metal oxide matrix interpenetrating with a polymeric phase. Additionally, the present invention provides methods of producing organic-inorganic composite materials.

26 Claims, No Drawings

OTHER PUBLICATIONS

B.M. Novak and M.W. Ellsworth, "Inverse" organic-inorganic composite materials: high glass content non-shrinking sol-gel composites; *Materials Science and Engineering*, A162 (1993) pp. 257-264.

B.M. Novak, Hybrid Nanocomposite Materials—Between Inorganic Glasses and Organic Polymers, *Advanced Materials*, 1993, 5, No. 6, pp. 442-433.

G. Kickelbick, Concepts for the incorporation of inorganic building blocks into organic polymers on a nanoscale, *Progress in Polymer Science*, 28 (2003) pp. 83-114.

R. Tamaki and Y. Chujo, Synthesis of Poly(vinyl alcohol)/Silica Gel Polymer Hybrids by In-Situ Hydrolysis Method, *Applied Organometallic Chemistry*, 12, pp. 755-762 (1998).

L. Klein, et al., Organic/Inorganic Hybrid Materials II, Materials Research Society Symposium Proceedings vol. 576, held Apr. 5-9, 1999.

R. Laine, et al., Organic/Inorganic Hybrid Materials, Materials Research Society Symposium Proceedings vol. 519, held Apr. 13-17, 1998.

* cited by examiner

ORGANIC-INORGANIC NANOCOMPOSITE MATERIALS AND METHODS OF MAKING AND USING THE SAME

CROSS-REFERENCE TO RELATED APPLICATIONS

The present application hereby claims priority under 35 U.S.C. §119(e) to U.S. Provisional Patent Application Ser. No. 60/866,497 filed Nov. 20, 2006 which is incorporated herein by reference.

FIELD OF THE INVENTION

The present invention relates to composite materials comprising interpenetrating organic and inorganic polymeric networks.

BACKGROUND

Organic-inorganic composite materials are finding increasing importance due to their extraordinary properties which arise from the synergism between the properties of the organic and inorganic components and interfacial regions. The tremendous possibilities of different combinations between organic and inorganic species enable the fabrication of nanocomposite materials in various shapes having unique properties which can not be obtained by traditional composite materials.

A critical challenge in the design of such organic-inorganic systems is control of the mixing between the two dissimilar species, which determinates the homogeneity of the final material or product. The formation of interpenetrating networks (IPNs) between organic and inorganic moieties (or species), starting from their perspective liquid forms, is one of the most promising ways to attack this challenge. The simultaneous synthesis of the networks can result in a substantially homogeneous material. A major problem during this process, however, arises from the different stabilities of organic and inorganic species. While inorganic systems are thermally quite stable and are often formed at high temperature, most organic ingredients have an upper temperature limit below 300° C. Therefore, the synthesis of organic-inorganic composite systems requires a strategy wherein the formation of the components is well-suited to each other; in this case, the organic species dictate the use of a low-temperature formation procedure. For this reason, milder reactions are required for the formation of the inorganic network. An ideal procedure for the generation of such composite materials is the sol-gel process. Sol-gel processes allow formation of the composite materials made of inorganic and organic components.

Sol-gel processes have been known as low temperature routes to making inorganic glass precursors in comparison to traditional $SiO_2$ glass formation at temperatures above 1400° C. Using the sol-gel processes, the condensation of reactive hydrolyzed metal alkoxides can occur in liquid form over a temperature range between 25 and 60° C. The sol-gel procedure is two step processes during which metal alkoxides are hydrolyzed to form metal hydroxides, which in turn condense to form a three-dimensional network.

Acid or base catalysts may be used for hydrolysis process. By varying the catalysts, significant effects on gelation time, bulk and apparent density, and volume shrinkage during drying are observed (Brinker C. J., Scherer G. W. *Sol-gel Science*. San Diego: Academic Press; 1990).

In another aspect, the sol-gel process through the organic saturated acid solvolysis of different metal alkoxides is also known (Pope E. J. A., Mackenzie J. D. *Journal of Non-Crystalline Solids*, 87, 1986, 185-198). The reaction of tetramethoxysilane (TMOS) or tetraethoxysilane (TEOS) with a variety of organic carboxylic acids at room temperature produces a gel over a time period between a few minutes to a few days.

Solvolysis with acetic acid can be found in the literature (Bekiari V., Lianos P. *Langmuir*, 14, 1998, 3459; Stathatos E., Lianos P., Lavrencic-Stangar U. L., Orel B. *Adv. Mater.*, 14, 2002, 354). In particular, it was found that acetic acid solvolysis proceeds by two-step reaction. In the first step, a silica ester ($CH_3$—COOSi—) is formed while in the second step SiOH forms in reaction with ethanol. From the latter, by inorganic polycondensation, a —O—Si—O— network is created, which provides the gelling agent. A simplified reaction scheme derived from FTIR data is represented by the following reactions:

Solvolysis Ester Formation:

$C_2H_5OH$>—SiOH+$CH_3COOC_2H_5$

Inorganic Polycondensation

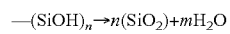

Additionally, it is known that hydrolysis and gelation with the use of strong inorganic acids like HCl is so rapid that it leads to the higher inhomogeneity of final product as compared with the case of using weaker organic acids for solvolysis. (Stathatos E., Lianos P., Lavrencic-Stangar U. L., Orel B. *Adv. Mater.*, 14, 2002, 354).

Although silicon alkoxides are probably most studied, other metals for use in sol-gel processes include titanium, tin, zirconium, cerium and aluminum (Kikelbick G. Prog. Polim. Sci., 28, 2003, 83-114). Therefore the inorganic part of the composite material is not limited to $SiO_2$.

Polymer-titanium composite materials present peculiar interest as high refractive index compositions. Long-Hua Lee et al. (Long-Hua Lee and Wen-Chang Chen. *Chem. Mater.*, 13, 2001, 1137-1142) reported the synthesis of high-refractive index trialkoxysilane-capped PMMA-titanium hybrid optical thin films being prepared by an in situ sol-gel process. The acrylic monomers used were methyl methacrylate (MMA) and 3-(trimethoxysilyl)propyl methacrylate (TM-SPM). Titanium (IV) n-butoxide was used for the preparation of the titanium network. The FTIR and DSC results indicate the successful bonding between the organic and inorganic moieties and the good dispersion of the PMMA segments in the titanium network. The off-resonant refractive indexes of the prepared thin films at 633 nm were in the range of 1.505-1.867 as the titanium content linearly increased from 2.9 to 70.7% Wt.

The synthesis of composite organic-inorganic composite materials can be conducted with the addition of different monomers or prepolymers into the reacting mixtures. The use of monomers is limited by their compatibility with starting reagents and by the use of hydrophilic medium (polar water solution) for a synthesis. For this reason, hydrophilic monomers such as HEMA or vinylpyrrolidone (VP) are usually used. More hydrophobic monomers like styrene and its analogues can be preliminary copolymerized with such precursors of the inorganic phase as TMSPM or triethoxyvinylsilane (TEVS) or styrylethyltrimethoxysilane (SEMS) (Wei Y et al. *J. Mater Res.*, 8, 1993, 1143-1152; Feng Q. et al. *J. Mater. Chem.*, 10, 2000, 2490-2494). The functionalized polymers are hydrolyzed and co-condensed with TEOS and/ or other precursors of the inorganic phase for the formation of an inorganic network via acid-catalyzed sol-gel route. The lack of well-defined glass-transition temperatures for the polymers in the silica matrix revealed that the polymer chains are uniformly distributed in the materials. So those hybrid materials have an excellent optical transparency.

Nevertheless, considering all the advantages of the sol-gel process, it is necessary to take into account a significant disadvantage, especially in the case of the synthesis of monolithic hybrid composite samples. Once formed, the gelled metal oxide network must be dried, requiring the removal of water excess, cosolvent(s) and liberated alcohol. It is this requisite drying process that effectively prevents the practical and reproducible synthesis of monoliths or thick films with dimensions greater than a few millimeters, because sol-gel organic-inorganic composites tend to shrink, crack and shatter. Cracking can be minimized in several ways, including very slow, controlled drying of the composite composition over the course of weeks or months, by increasing the average pore size through the introduction of colloidal silica seed particles, by adding surfactants, by supercritical drying or by the addition of special reagents.

One of the major obstacles to the widespread application of sol-gel techniques is the fact that this drying process is accompanied by extraordinary shrinkage of the solid inorganic phase. Related to the volume fraction of volatiles removed, this shrinkage is routinely of the order 50-70% (Novak B. M., Ellsworth M. W. *Mater. Sci. and Eng., A*162, 1993, 257-264). Shrinkage on this scale precludes many molding applications and can introduce a high degree of stress in sol-gel monolithic composites. In the view of this fact, it is clear that the resulting weight yield of solid product of sol-gel process is limited up to 20-30%. Even in the case of solvolysis of metal alkoxides with pure organic acids, without water and cosolvent(s), there are the liquid by-products (acid esters and water as the polycondensation by-product). As a result, the shrinkage exists in all modification of sol-gel techniques.

In view of the problems and disadvantages associated with existing organic-inorganic nanocomposites, it would be desirable to provide new organic-inorganic nanocomposite materials and new methods of making organic-inorganic nanocomposite materials.

SUMMARY

Certain embodiments of the present invention provide organic-inorganic nanocomposite materials comprising an inorganic metal oxide matrix interpenetrated by an organic polymeric phase. Certain embodiments of the present invention provide compositions comprising organic-inorganic nanocomposite materials. Moreover, certain embodiments of the present invention provide methods of producing organic-inorganic nanocomposite materials comprising an inorganic metal oxide matrix interpenetrated by an organic polymeric phase.

In one embodiment, the present invention provides an organic-inorganic nanocomposite material comprising an inorganic metal oxide matrix interpenetrating with a polymeric phase, the metal oxide matrix and polymeric phase comprising products of a reaction mixture comprising:
a) a metal alkoxide component of the formula $$R_xM(OR')_{m-x}$$

wherein M is a metal;
wherein R is selected from the group consisting of -alkyl, -alkoxy, -acryl, -methacryl, -alkenyl, -cycloalkyl, -heterocyclyl, -aryl, -heteroaryl, -alkylene-cycloalkyl, -cycloalkylene-alkyl, -alkylene-aryl, -alkylene-heteroaryl, -arylene-alkyl, -heteroarylene-alkyl, -alkylene-acryl, and -alkylene-methacryl;
wherein R' is -alkyl; and
wherein x is 1, 2 or 3 and m is 3 or 4;
   (b) an unsaturated organic acid component;
   (c) a dehydration component; and
   (d) a free radical initiator component.

In some embodiments of the present invention, the reaction mixture does not comprise additional solvents or cosolvents, such as water, polar solvents, or organic solvents.

In some embodiments of an organic-inorganic nanocomposite material, the reaction mixture further comprises a cross-linking component. Moreover, in some embodiments of an organic-inorganic nanocomposite material, the reaction mixture further comprises at least one additional monomer and/or prepolymer.

In some embodiments, the present invention provides an organic-inorganic nanocomposite material comprising an inorganic matrix interpenetrating with a polymeric phase, wherein the inorganic matrix has the formula:

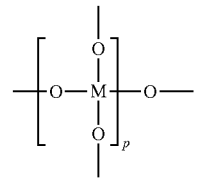

wherein M is a metal and p is the number of repeat units and wherein the inorganic matrix has a drying volume shrinkage of less than about 20%. In some embodiments, the inorganic matrix has a drying volume shrinkage of less than about 10%. In another embodiment, the inorganic matrix has a drying volume shrinkage of less than about 5%. In some embodiments, the inorganic matrix has a drying volume shrinkage of less than about 1%. In a further embodiment, the inorganic matrix has no or substantially no drying volume shrinkage.

Some embodiments of the present invention provide compositions comprising organic-inorganic nanocomposite materials of the present invention. In one embodiment, a printed wire board or printed circuit board is provided comprising a substrate, the substrate comprising an organic-inorganic nanocomposite material of the present invention. As used herein, the term "printed wire board" is used interchangeably with "printed circuit board." Any of the organic-inorganic nanocomposite materials of the present invention can be used as a substrate of a printed wire board.

In some embodiments, a printed wire board further comprises one or a plurality of traces operable to connect a variety of electronic components supported by the substrate comprising an organic-inorganic nanocomposite material of the present invention.

Some embodiments of the present invention provides methods of producing an organic-inorganic nanocomposite material. In one embodiment, a method of producing an organic-inorganic nanocomposite material comprises providing a reaction mixture, forming a metal oxide matrix from the reaction mixture, consuming water resulting from the formation of the metal oxide matrix with a dehydration component, and forming a polymeric phase from the reaction mixture, wherein the polymeric phase is at least partially formed during the formation of the metal oxide matrix. In some embodiments of methods of producing organic-inorganic nanocomposite materials of the present invention, the polymeric phase is interpenetrating with the inorganic metal oxide matrix. In some embodiments, the polymeric phase is chemically bonded to the inorganic metal oxide matrix.

In some embodiments of a method of producing an organic-inorganic nanocomposite material, a reaction mixture comprises:

(a) a metal alkoxide component of the formula:

$$R_xM(OR')_{m-x}$$

wherein M is a metal;
wherein R is selected from the group consisting of -alkyl, -alkoxy, -acryl, -methacryl, -alkenyl, -cycloalkyl, -heterocyclyl, -aryl, -heteroaryl, -alkylene-cycloalkyl, -cycloalkylene-alkyl, -alkylene-aryl, -alkylene-heteroaryl, -arylene-alkyl, -heteroarylene-alkyl, -alkylene-acryl, and -alkylene-methacryl;
wherein R' is -alkyl; and
wherein x is 1, 2 or 3 and m is 3 or 4;

(b) an unsaturated organic acid component;
(c) a dehydration component; and
(d) a free radical initiator component.

In some embodiments of methods of the present invention, the reaction mixture does not comprise additional solvents or cosolvents, such as water, polar solvents, or organic solvents.

Forming a metal oxide matrix from the reaction mixture, in some embodiments, comprises performing solvolysis of the metal alkoxide component to produce a metal hydroxide component and polycondensing the metal hydroxide component to form the inorganic metal oxide matrix.

In some embodiments of methods of the present invention, consuming water resulting from the formation of the metal oxide matrix with a dehydration component comprises reacting the water with the dehydration component. In some embodiments, water resulting from the formation of the metal oxide matrix is reacted with an anhydride of an unsaturated organic acid yielding the hydrolysis of the anhydride. In some embodiments, water resulting from the formation of the metal oxide matrix is reacted with an isocyanate yielding an amine and carbon dioxide.

In some embodiments, forming a polymeric phase from the reaction mixture comprises polymerizing the unsaturated organic acid component. In some embodiments, the reaction mixture further comprises a cross-linking component. In such embodiments, a method of producing an organic-inorganic nanocomposite material can further comprise cross-linking the polymeric phase with the crosslinking agent.

Some embodiments of the present invention provide methods of producing printed wire boards. In one embodiment, a method of producing a printed wire board comprises providing a substrate comprising an organic-inorganic nanocomposite material of the present invention and disposing one or a plurality of traces on the substrate. Methods of producing printed wire boards, according to some embodiments of the present invention, can offer advantages over prior methods of constructing printed wire boards. One advantage of some embodiments is that organic-inorganic nanocomposite substrates can be produced at temperatures significantly below that of fiber glass reinforced substrates, such as fiber glass reinforced fabrics. Organic-inorganic nanocomposite substrate production according to some embodiments, for example, can be carried out at temperatures in the range of about 40° C. to about 150° C. while fiber glass reinforced substrates are typically produced at temperatures of at least 1450° C. for batch melting and at least 1170° C. for glass fiber formation.

These and other embodiments are described in greater detail in the Detailed Description which follows.

DETAILED DESCRIPTION

For the purposes of this specification, unless otherwise indicated, all numbers expressing quantities of ingredients, reaction conditions, and so forth used in the specification are to be understood as being modified in all instances by the term "about." Accordingly, unless indicated to the contrary, the numerical parameters set forth in the following specification are approximations that can vary depending upon the desired properties sought to be obtained by the present invention. At the very least, and not as an attempt to limit the application of the doctrine of equivalents to the scope of the claims, each numerical parameter should at least be construed in light of the number of reported significant digits and by applying ordinary rounding techniques.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all subranges subsumed therein. For example, a stated range of "1 to 10" should be considered to include any and all subranges between (and inclusive of) the minimum value of 1 and the maximum value of 10; that is, all subranges beginning with a minimum value of 1 or more, e.g. 1 to 6.1, and ending with a maximum value of 10 or less, e.g., 5.5 to 10. Additionally, any reference referred to as being "incorporated herein" is to be understood as being incorporated in its entirety.

It is further noted that, as used in this specification, the singular forms "a," "an," and "the" include plural referents unless expressly and unequivocally limited to one referent.

DEFINITIONS

The following is a list of definitions of terms used to describe various aspects of compositions and methods of the present invention.

The term "interpenetrating polymers" refers to an organic polymers and/or copolymers which occupy the spaces in a matrix.

The term "alkyl" designates a saturated straight or branched hydrocarbon group. In some embodiments, alkyl refers to a saturated straight or branched hydrocarbon group having 1 to 6 carbon atoms. Representative examples include, but are not limited to, methyl, ethyl, n-propyl, isopropyl, butyl, isobutyl, sec-butyl, tert-butyl, n-pentyl, isopentyl, neopentyl, tert-pentyl, n-hexyl, isohexyl and the like.

The term "alkoxy" designates a group —O—R wherein R is alkyl as defined herein. Representative examples include, but are not limited to, methoxy, ethoxy, n-propoxy, isopropoxy, butoxy, isobutoxy, sec-butoxy, tert-butoxy, n-pentoxy, isopentoxy, neopentdoxy, tert-pentoxy, n-hexoxy, isohexoxy and the like.

The term "cycloalkyl" designates an alicyclic hydrocarbon group optionally possessing one or more degrees of unsaturation having from three to twelve carbon atoms. Representative examples are cyclopropyl, cyclobutyl, cyclopentyl, cyclohexyl, cycloheptyl, cyclooctyl, cyclononyl, and cyclodecyl.

The term "alkenyl" designates an olefinically unsaturated branched or straight hydrocarbon group having at least one double bond. Examples of such groups include, but are not limited to, vinyl, 1-propenyl, 2-propenyl, allyl, iso-propenyl, 1,3-butadienyl, 1-butenyl, hexenyl, pentenyl and the like.

The term "heterocyclyl" designates a saturated 3 to 12 membered ring containing one or more heteroatoms selected from nitrogen, oxygen and sulfur. Representative examples are pyrrolidyl, piperidyl, piperazinyl, morpholinyl, thiomorpholinyl, aziridinyl, tetrahydrofuranyl and the like.

The term "aryl" designates a carbocyclic aromatic ring system being either monocyclic, bicyclic, or polycyclic, such as phenyl, biphenyl, naphthyl, anthracenyl, phenanthrenyl, fluorenyl, indenyl, pentalenyl, azulenyl, biphenylenyl and the like. Aryl is also intended to include the partially hydrogenated derivatives of the carbocyclic aromatic systems enumerated above. Non-limiting examples of such partially hydrogenated derivatives are 1,2,3,4-tetrahydronaphthyl, 1,4-dihydronaphthyl and the like.

The term "heteroaryl" designates a heterocyclic aromatic ring system containing one or more heteroatoms selected from nitrogen, oxygen and sulfur such as furyl, thienyl, pyrrolyl, oxazolyl, thiazolyl, imidazolyl, isoxazolyl, isothiazolyl, 1,2,3-triazolyl, 1,2,4-triazolyl, pyranyl, pyridyl, pyridazinyl, pyrimidinyl, pyrazinyl, 1,2,3-triazinyl, 1,2,4-triazinyl, 1,3,5-triazinyl, 1,2,3-oxadiazolyl, 1,2,4-oxadiazolyl, 1,2,5-oxadiazolyl, 1,3,4-oxadiazolyl, 1,2,3-thiadiazolyl, 1,2,4-thiadiazolyl, 1,2,5-thiadiazolyl, 1,3,4-thiadiazolyl, tetrazolyl, thiadiazinyl, indolyl, isoindolyl, benzofuranyl, benzothiophenyl(thianaphthenyl), indazolyl, benzimidazolyl, benzthiazolyl, benzisothiazolyl, benzoxazolyl, benzisoxazolyl, purinyl, quinazolinyl, quinolizinyl, quinolinyl, isoquinolinyl, quinoxalinyl, naphthyridinyl, pteridinyl, carbazolyl, azepinyl, diazepinyl, acridinyl and the like. Heteroaryl is also intended to include the partially hydrogenated derivatives of the heterocyclic systems enumerated above. Non-limiting examples of such partially hydrogenated derivatives are 2,3-dihydrobenzofuranyl, 3,4-dihydroisoquinolinyl, pyrrolinyl, pyrazolinyl, indolinyl, oxazolidinyl, oxazolinyl, oxazepinyl and the like.

The term "alkylene" designates a saturated straight or branched divalent hydrocarbon radical.

The term "cycloalkyl" designates an alicyclic divalent hydrocarbon radical optionally possessing one or more degrees of unsaturation having from three to twelve carbon atoms.

The term "alkenylene" designates an olefinically unsaturated branched or straight divalent hydrocarbon radical having at least one double bond.

The term "heterocyclylene" designates a saturated 3 to 12 membered ring diradical containing one or more heteroatoms selected from nitrogen, oxygen and sulfur.

The term "arylene" designates a carbocyclic aromatic ring diradical being either monocyclic, bicyclic, or polycyclic.

The term "heteroarylene" designates a heterocyclic aromatic ring diradical containing one or more heteroatoms selected from nitrogen, oxygen and sulfur.

The term "prepolymer" designates a polymer of sufficient molecular weight and of desirable chemical structure being solubilized into a reaction mixture of starting reagent and being operable to effectuate a change in the properties of an organic-inorganic nanocomposite material.

Certain embodiments of the present invention provide organic-inorganic nanocomposite materials comprising an inorganic metal oxide matrix interpenetrated by an organic polymeric phase.

In one embodiment, the present invention provides an organic-inorganic nanocomposite material comprising an inorganic metal oxide matrix interpenetrating with a polymeric phase, the inorganic metal oxide matrix and polymeric phase comprising products of a reaction mixture comprising:
  a) a metal alkoxide component of the formula

wherein M is a metal;
wherein R is selected from the group consisting of -alkyl, -alkoxy, -acryl, -methacryl, -alkenyl, -cycloalkyl, -heterocyclyl, -aryl, -heteroaryl, -alkylene-cycloalkyl, -cycloalkylene-alkyl, -alkylene-aryl, -alkylene-heteroaryl, -arylene-alkyl, -heteroarylene-alkyl, -alkylene-acryl, and -alkylene-methacryl;
wherein R' is -alkyl; and
wherein x is 1, 2 or 3 and m is 3 or 4;
  (b) an unsaturated organic acid component;
  (c) a dehydration component; and
  (d) a free radical initiator component.

In some embodiments of an organic-inorganic nanocomposite material, the reaction mixture further comprises a cross-linking component. Moreover, in some embodiments of an organic-inorganic nanocomposite material, the reaction mixture further comprises at least one additional monomer and/or prepolymer.

Turning now to components that can be included in various embodiments of a reaction mixture of the present invention, a reaction mixture of the present invention comprises a metal alkoxide of the formula:

wherein M is a metal;
wherein R is selected from the group consisting of -alkyl, -alkoxy, -acryl, -methacryl, -alkenyl, -cycloalkyl, -heterocyclyl, -aryl, -heteroaryl, -alkylene-cycloalkyl, -cycloalkylene-alkyl, -alkylene-aryl, -alkylene-heteroaryl, -arylene-alkyl, -heteroarylene-alkyl, -alkylene-acryl, and -alkylene-methacryl;
wherein R' is -alkyl; and
wherein x is 1, 2 or 3 and m is 3 or 4;

As detailed herein, the metal alkoxide component participates in the formation of the inorganic metal oxide matrix of the organic-inorganic nanocomposite material. In some embodiments, metals suitable for serving as M comprise silicon, titanium, aluminum, or zirconium. Moreover, in some embodiments, suitable metal alkoxides comprise tetramethoxysilane (TMOS), tetraethoxysilane (TEOS), 3-(trimethoxysilyl)propyl methacrylate (TMSPM), triethoxyvinylsilane (TEVS), styrylethyltrimethoxysilane (SEMS), titanium ethoxide (TEO), titanium isopropoxide (TIPO), aluminum triethoxide (ATO), aluminum isopropoxide (TIPO), zirconium ethoxide (ZEO), or mixtures thereof.

In some embodiments, the metal alkoxide component comprises a single species of metal alkoxide. In other embodiments, the metal alkoxide component comprises a mixture of a plurality of metal alkoxide species. In one embodiments, for example, a metal alkoxide component of a reaction mixture comprises TEOS as the only metal alkoxide species. In another embodiment, a metal alkoxide component comprises a mixture of TEOS and TMSPM. Embodiments of metal alkoxide components of the present invention contemplate any mixture of metal alkoxides species, including mixtures comprising metal alkoxide species having different metal centers.

In some embodiments, a metal alkoxide component is present in the reaction mixture in an amount up to about 40 weight percent. In another embodiment, a metal alkoxide component is present in the reaction mixture in an amount up to about 30 weight percent. In some embodiments, a metal alkoxide component is present in the reaction mixture in an amount up to about 25 weight percent. In some embodiments, a metal alkoxide component is present in the reaction mixture in an amount up to about 20 weight percent. In one embodiment, a metal alkoxide component is present in the reaction mixture in an amount greater than about 10 weight percent.

In addition to a metal alkoxide component, a reaction mixture comprises an unsaturated organic acid component. The unsaturated organic acid component is operable to undergo polymerization in the formation of the polymeric phase of the organic-inorganic nanocomposite material. In some embodiments, the unsaturated organic acid component comprises unsaturated organic acids of the formula:

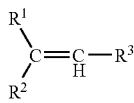

wherein $R^1$, $R^2$, and $R^3$ are independently selected from the group consisting of -hydrogen, -alkyl, and -carboxyl.

In some embodiments, suitable unsaturated organic acids comprise acrylic acid, methacrylic acid, crotonic acid, itaconic acid, maleic acid, or mixtures thereof. In some embodiments, the unsaturated organic acid component comprises a single species of unsaturated organic acid. In other embodiments, the unsaturated organic acid component comprises a mixture of a plurality of unsaturated organic acid species. In one embodiment, for example, an unsaturated organic acid component of a reaction mixture comprises acrylic acid as the only unsaturated organic acid species. In another embodiment, an unsaturated organic acid component comprises a mixture of acrylic acid and methacrylic acid. Embodiments of unsaturated organic acid components of the present invention contemplate any mixture of unsaturated organic acid species.

In some embodiments, an unsaturated organic acid component is present in the reaction mixture in an amount up to about 70 weight percent. In another embodiment, an unsaturated organic acid component is present in the reaction mixture in an amount up to about 60 weight percent. In some embodiments, an unsaturated organic acid component is present in the reaction mixture in an amount up to about 40 weight percent. In one embodiment, an unsaturated organic acid component is present in the reaction mixture in an amount greater than about 5 weight percent. In some embodiments, an unsaturated organic acid component is present in the reaction mixture in an amount greater than about 10 weight percent. In some embodiments, an unsaturated organic acid component is present in the reaction mixture in an amount greater than about 20 weight percent.

In some embodiments, a reaction mixture additionally comprises a dehydration component. A dehydration component can consume water in the reaction mixture by reacting with the water in the reaction mixture. The consumption of water in the reaction mixture by a dehydration component, according to some embodiments of the present invention, can reduce or eliminate the water content in the organic-inorganic nanocomposite product. As described herein, a reduction or elimination of water in the organic-inorganic nanocomposite product of the reaction mixture can minimize or preclude compressive and tensional stresses within the nanocomposite associated with water loss during drying processes, leading to a mechanically stable material. In some embodiments, a dehydration component can participate in the polymerization process for forming the polymeric phase of the organic-inorganic nanocomposite.

In some embodiments, a dehydration component comprises anhydrides of unsaturated organic acids. In some embodiments, the dehydration component comprises anhydrides of unsaturated organic acids having the formula:

$$C_xH_yO_3$$

wherein x is an integer from 4 to 8 and y is an integer from 2 to 10. In some embodiments, anhydrides of unsaturated organic acids comprise acrylic anhydride, methacrylic anhydride, itaconic anhydride, maleic anhydride, or mixtures thereof.

In some embodiments, a dehydration component comprises an isocyanate. Isocyanates suitable for use as a dehydration component, in some embodiments, are of the formula:

$$R^4-N=C=O$$

wherein $R^4$ is selected from the group consisting of acryl-alkyl, methacryl-alkyl, alkenyl, and alkenylene-alkyl. In one embodiment, an isocyanate suitable for use as a dehydration component comprises 2-isocyanatoethyl methacrylate (ICEM).

In some embodiments, a dehydration component comprises a single species of an anhydride of an unsaturated organic acid. In other embodiments, a dehydration component comprises a mixture of a plurality of species of anhydrides of unsaturated organic acids. In another embodiment, a dehydration component comprises a single species of isocyanate. In some embodiments, a dehydration component comprises a plurality of species of isocyanates. In some embodiments, a dehydration component comprises a mixture of isocyanates and anhydrides of unsaturated organic acids. Embodiments of dehydration components of the present invention contemplate any mixture isocyanates and/or anhydrides of unsaturated organic acids.

In some embodiments, a dehydration component is present in the reaction mixture in an amount up to about 60 weight percent. In another embodiment, a dehydration component is present in the reaction mixture in an amount up to about 45 weight percent. In some embodiments, a dehydration component is present in the reaction mixture in an amount up to about 30 weight percent. In one embodiments, a dehydration component is present in the reaction mixture in an amount up to about 20 weight percent. In some embodiments, a dehydration component is present in the reaction mixture in an amount greater than about 10 weight percent.

A reaction mixture, in some embodiments, can additionally comprise a free radical initiator component. A free radical initiator component is operable to initiate polymerization of the unsaturated organic acids and other unsaturated species in the reaction mixture to produce the polymeric phase of the organic-inorganic nanocomposite material. Free radical initiators suitable for use in some embodiments of the present invention comprise azo compounds, including azobisisobutyronitrile (AIBN), 1,1'-azobis(cyclohexanecarbonitrile) (ABCN), or azo 88. In some embodiments, a free radical initiator comprises organic peroxides such as benzoyl peroxide, dicumyl peroxide, or mixtures thereof. In some embodiments, a free radical initiator comprises electromagnetic radiation, including UV light or temperatures over 60° C. (thermopolymerization). In one embodiment, a free radical initiator comprises ammonium persulfate with sodium metabisulfite. In some embodiments, a free radical initiator component comprises one species of free radical initiator or a mixture of free radical initiator species. In one embodiment, for example, a free radical initiator component comprises a mixture of AIBN and benzoyl peroxide. Embodiments of free radical initiator components of the present invention contemplate any mixture of free radical initiators.

In some embodiments, a reaction mixture comprises a free radical initiator component in an amount up to about 1.0 weight percent. In some embodiments, a reaction mixture comprises a free radiation initiator in an amount greater than about 0.05 weight percent.

A reaction mixture, in some embodiments further comprises a cross-linking component. A cross-linking component can cross-link polymer chains of the polymeric phase. In some embodiments, a cross-linking component comprises (ethylene glycol)$_n$-dimethacrylate, (ethylene glycol)$_n$-diacrylate, or mixtures thereof wherein n is an integer from 1 to 4. In some embodiments, a cross-linking component comprises trimethylpropane ethoxylate, bisphenol A ethoxylate, diacrylate, dimethacrylate, divinyl benzene, or mixtures thereof. In one embodiment, a cross-linking species comprises the isocyanates of the dehydration component.

In some embodiments, a cross-linking component comprises one cross-linking species only. In other embodiments, a cross-linking component comprises a plurality of cross-linking species. Embodiments of the cross-linking components of the present invention contemplate any mixture of cross-linking species. The amount of a cross-linking component included in a reaction mixture can be dependent upon the degree of cross-linking desired and the identity of the cross-linking component.

In some embodiments, a reaction mixture further comprises at least one additional monomer. The at least one additional monomer, in some embodiments, participates in the formation of the polymeric phase of the organic-inorganic nanocomposite material and can be operable to effectuate a desirable change in one or more properties of the organic-inorganic nanocomposite material. In some embodiments, the at least one additional monomer comprises acrylates, methacrylates, styrene, vinylacetate, vinyl alcohol, N-vinylpyrrolidone, or mixtures thereof. The amount of the at least one additional monomer present in the reaction mixture can vary depending on the identity of the monomer and the compatibility of the monomer with other reagents in the reaction mixture.

In some embodiments, a reaction mixture further comprises at least one additional prepolymer. The at least one additional prepolymer, in some embodiments, comprises polystyrene, polyvinylpyridine, polyvinyl alcohol, poly-N,N-dimethylacylamide, polymethylmethacrylate, polyvinyl acetate, or mixtures thereof. The prepolymer, in some embodiments, can be operable to effectuate a desirable change in one or more properties of the organic-inorganic nanocomposite material. The amount of the at least one additional prepolymer present in the reaction mixture can vary depending on the identity of the prepolymer and the compatibility of the prepolymer with other reagents in the reaction mixture.

While not wishing to be bound by any theory, it is believed that the formation of the inorganic metal oxide matrix and the polymeric phase of the organic-inorganic nanocomposite material from the reaction mixture proceeds according to the following description and reaction schemes.

Solvolysis and polycondensation reactions are the sources of the formation of inorganic phase. The metal alkoxides are solvolyzed according to reaction Scheme (I).

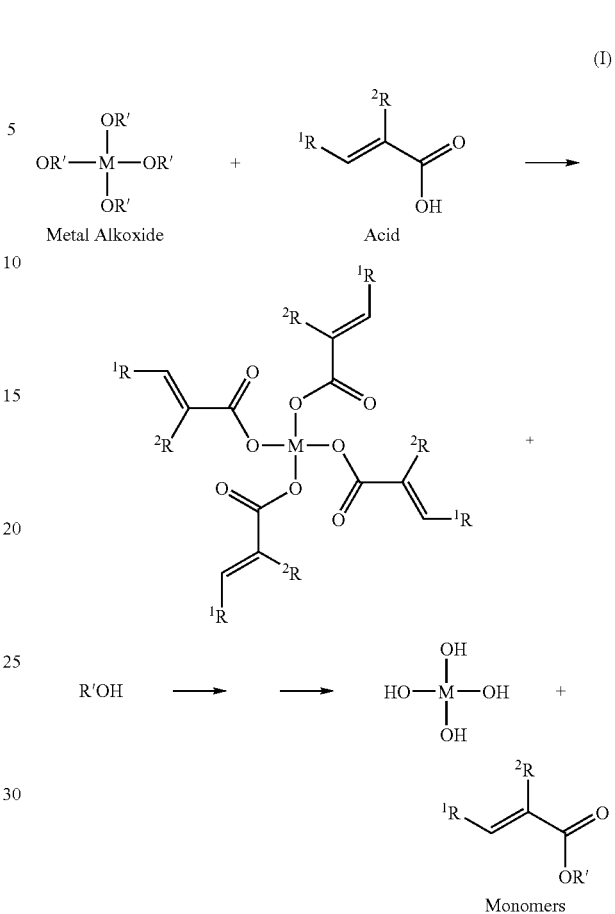

wherein R', $R^1$ and $R^2$ are consistent with the same defined hereinabove.

The metal hydroxide products subsequently undergo a polycondensation reaction to generate an inorganic metal oxide matrix and water according to reaction Scheme (II).

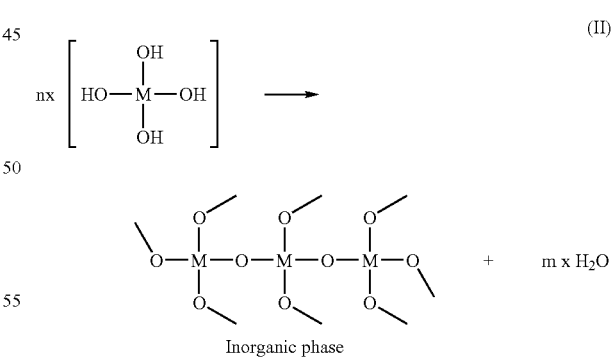

The water by-product of the polycondensation reaction undergoes reaction with the dehydration component comprising anhydrides of unsaturated organic acids, isocyanates, or combinations thereof. The reaction of water with the anhydrides, isocyanates, or mixtures thereof consumes the water thereby removing the water from the reaction mixture and the resulting organic-inorganic nanocomposite material. Reaction of water with an isocyanate is provided in Scheme (III).

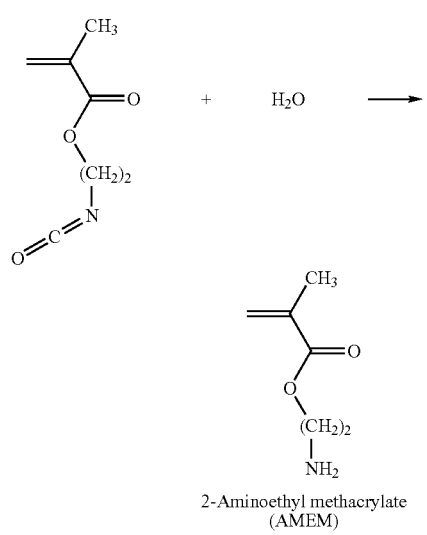

2-Aminoethyl methacrylate
(AMEM)

Moreover reaction of water with an anhydride of an unsaturated organic acid is provided in Schemes (IV) and (V).

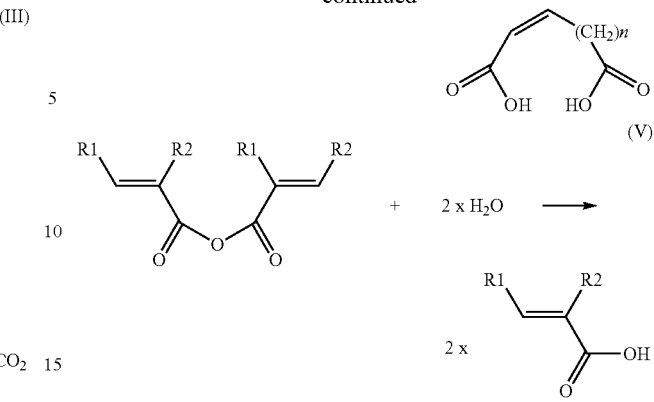

wherein $R^1$ and $R^2$ are consistent with the same defined hereinabove.

The unsaturated organic acid esters resulting from the solvolysis of the metal alkoxide component undergo polymerization to form the polymeric phase of the organic-inorganic nanocomposite material. In some embodiments, unsaturated organic acids resulting from the hydrolysis of the corresponding unsaturated organic acid anhydrides participate in the polymerization process and are incorporated into polymeric phase. Moreover, in some embodiments, cross-linking agents, when present in the reaction mixture, participate in the polymerization process and provide crosslinks between polymeric chains of the polymeric phase. Reaction Scheme (VI) provides formation of a polymeric phase according to one embodiment of the present invention.

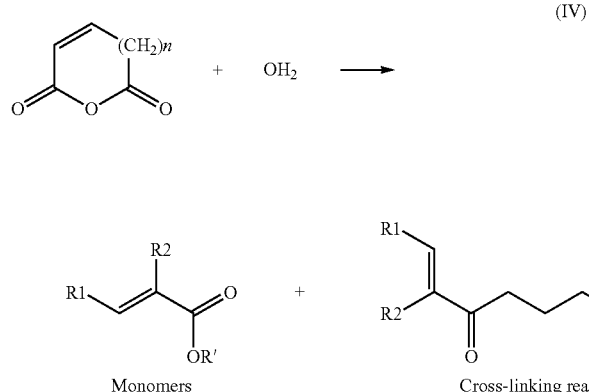

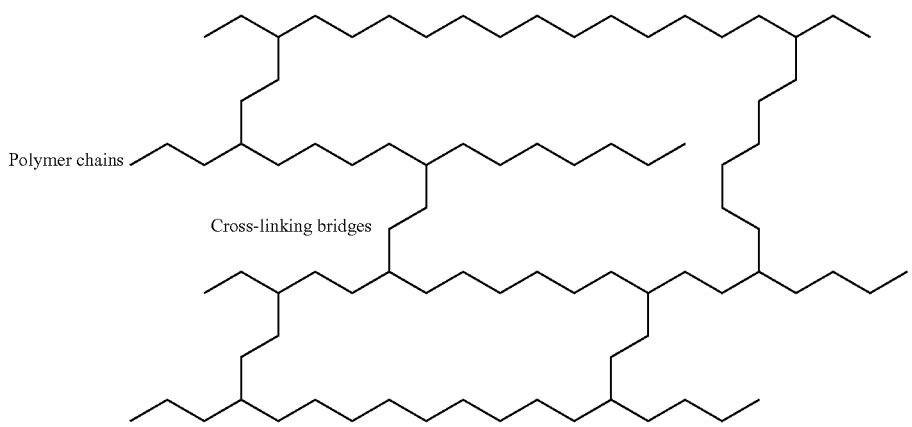

wherein R¹ and R² are consistent with the same defined hereinabove. The degree of cross-linking in the polymeric phase can be controlled by the amount of cross-linking component in the reaction mixture and the identity of the cross-linking component.

In some embodiments wherein the dehydration component comprises an isocyanate, a separate cross-linking component is not included in the reaction mixture. As provided herein, in some embodiments, an isocyanate can perform the functions of a dehydration component and a cross-linking component. Reaction Scheme (VII) illustrates the bi-functionality of an isocyanate dehydration component.

embodiments, is achieved through the use of a metal alkoxide comprising a polymerizable group, such as the methacrylate group of TMSPM. An organic polymerizable group of a metal alkoxide can allow the metal alkoxide to participate in both the formation of the inorganic metal oxide matrix and the polymerization leading to the formation of polymeric phase.

In some embodiments, the present invention provides an organic-inorganic nanocomposite material comprising an inorganic matrix interpenetrating with a polymeric phase, wherein the inorganic matrix has the formula:

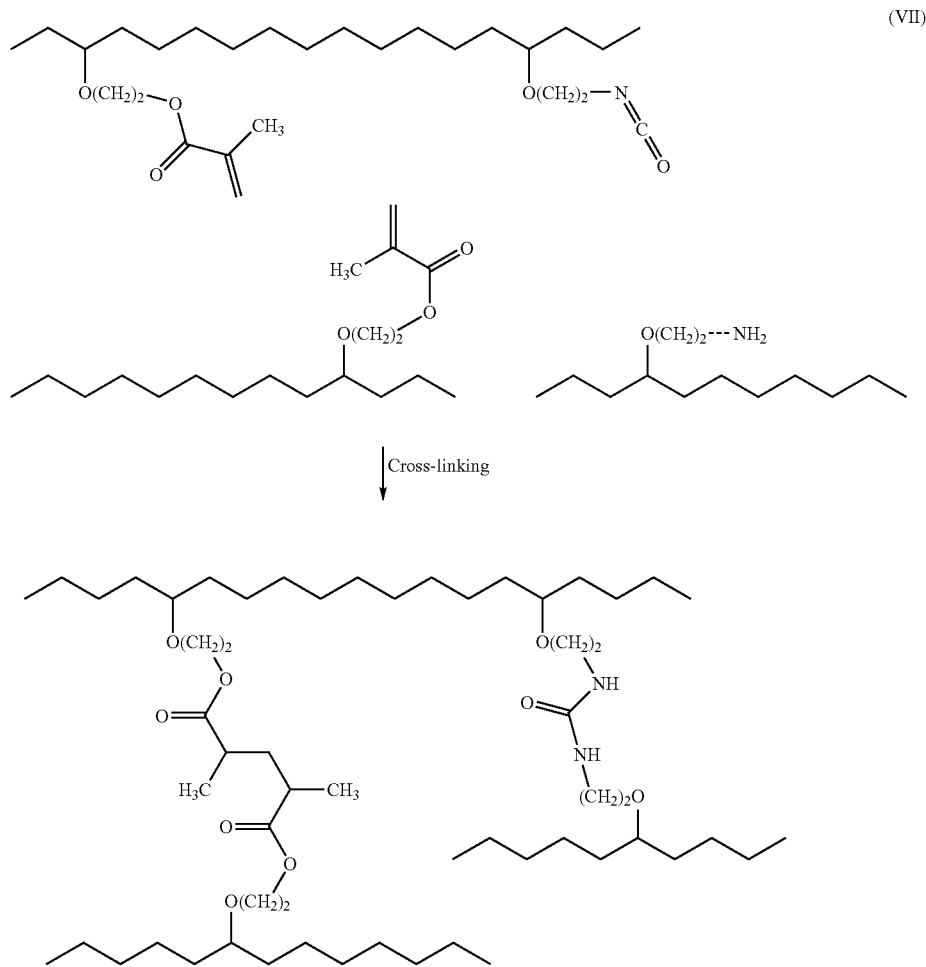

(VII)

The use of an dehydration component comprising an isocyanate does not result in the formation of polar carboxylate groups. As a result, the lack of free carboxylate groups in the polymeric phase of the organic-inorganic nanocomposite material can improve the dielectric properties of the material while reducing water absorption by the nanocomposite material.

In some embodiments, the solvolysis, polycondensation, and polymerization reactions are occurring simultaneously in the reaction mixture to provide an organic-inorganic nanocomposite material comprising an inorganic metal oxide matrix interpenetrating with a polymeric phase.

In some embodiments, the polymeric phase is chemically bound to the inorganic metal oxide matrix. Bonding of the polymeric phase to the inorganic metal oxide matrix, in some

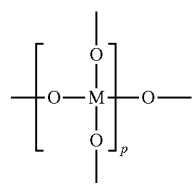

wherein M is a metal and p is the number of repeat units and wherein the inorganic matrix has a drying volume shrinkage of less than about 20%. As used herein, the drying volume shrinkage of the inorganic matrix designates the percent by which the volume of the inorganic matrix is reduced when the organic-inorganic nanocomposite material is dried.

In some embodiments, the inorganic matrix has a drying volume shrinkage of less than about 10%. In another embodiment, the inorganic matrix has a drying volume shrinkage of less than about 5%. In some embodiments, the inorganic matrix has a drying volume shrinkage of less than about 1%. In a further embodiment, the inorganic matrix has no or substantially no drying volume shrinkage.

In some embodiments, an organic-inorganic nanocomposite material of the present invention has the physical properties provided in Table I.

TABLE I

Properties of Organic-Inorganic Nanocomposite Materials

| Density $(g/cm^3)$ | Water Absorption (%) | Tensile Strength (MPa) | Tensile Modulus (GPa) | Dielectric Constant @ 1 MHz | CTE $(ppm/°C.)$ | Glass Transition Temperature (DSC) °C. | Hardness (MPa) |
|---|---|---|---|---|---|---|---|
| 1.1-1.2 | 0.9-3.5 (72 hr) | 77-78 | 3.5-3.7 | 2.9-3.5 | 21 | 130-225 | 340-400 |

Moreover, in some embodiments, an organic-inorganic nanocomposite material of the present invention can be radiation transmissive. Radiation transmissive, as used herein, refers to the ability to at least partially pass ultraviolet radiation, visible radiation, infrared radiation, or mixtures thereof.

In another embodiment, there are provided compositions comprising organic-inorganic nanocomposite materials of the present invention. In one embodiment, a printed wire board is provided comprising a substrate, the substrate comprising an organic-inorganic nanocomposite material of the present invention. Any of the organic-inorganic nanocomposite materials of the present invention can be used as a substrate of a printed wire board. The dielectric and mechanical properties of organic-inorganic nanocomposite materials of the present invention summarized above permit the use of such materials as substrates of printed wire boards.

In some embodiments, a printed wire board further comprises one or a plurality of traces operable to connect a variety of electronic components supported by the substrate comprising an organic-inorganic nanocomposite material of the present invention. In some embodiments, substrates of printed wire boards comprising organic-inorganic nanocomposite materials of the present invention can have any desirable dimensions, including thickness and printable surface area.

In another embodiment, the present invention provides methods of producing an organic-inorganic nanocomposite material. In one embodiment, a method of producing an organic-inorganic nanocomposite material of the present invention comprises providing a reaction mixture, forming an inorganic metal oxide matrix from the reaction mixture, consuming water resulting from the formation of the metal oxide matrix with a dehydration component, and forming a polymeric phase from the reaction mixture, wherein the polymeric phase is at least partially formed during the formation of the metal oxide matrix. In some embodiments of the methods of producing organic-inorganic nanocomposite materials of the present invention, the polymeric phase is interpenetrating with the inorganic metal oxide matrix. In some embodiments, the polymeric phase is chemically bonded to the inorganic metal oxide matrix.

In some embodiments of a method of producing an organic-inorganic nanocomposite material, a reaction mixture comprises:

(a) a metal alkoxide component of the formula:

wherein M is a metal;
wherein R is selected from the group consisting of -alkyl, -alkoxy, -acryl, -methacryl, -alkenyl, -cycloalkyl, -heterocyclyl, -aryl, -heteroaryl, -alkylene-cycloalkyl, -cycloalkylene-alkyl, -alkylene-aryl, -alkylene-heteroaryl, -arylene-alkyl, -heteroarylene-alkyl, -alkylene-acryl, and -alkylene-methacryl;
wherein R' is -alkyl; and
wherein x is 1, 2 or 3 and m is 3 or 4;

(b) an unsaturated organic acid component;
(c) a dehydration component; and
(d) a free radical initiator component.

In some embodiments of methods of the present invention, a reaction mixture does not comprise additional solvents or cosolvents, such as water, polar solvents, or organic solvents.

Moreover, forming a metal oxide matrix from the reaction mixture, in some embodiments of methods of the present invention, comprises performing solvolysis of the metal alkoxide component to produce a metal hydroxide component and polycondensing the metal hydroxide component to form the metal oxide matrix, as illustrated in reaction Schemes (I) and (II).

In some embodiments of methods of the present invention, consuming water resulting from the formation of the metal oxide matrix with a dehydration component comprises reacting the water with the dehydration component. In one embodiment, water resulting from the formation of the metal oxide matrix is reacted with an anhydride of an unsaturated organic acid yielding the hydrolysis of the anhydride, as illustrated in reaction Scheme (IV) In another embodiment, water resulting from the formation of the metal oxide matrix is reacted with an isocyanate yielding an amine and carbon dioxide, as illustrated in reaction Scheme (III).

In some embodiments, forming a polymeric phase from the reaction mixture comprises polymerizing the unsaturated organic acid component. In some embodiments, polymerizing the unsaturated organic acid component comprises polymerizing unsaturated organic acid esters resulting from the solvolysis of the metal alkoxide component, as illustrated in reaction Scheme (VI).

In some embodiments, unsaturated organic acids resulting from the hydrolysis of the corresponding unsaturated organic acid anhydrides of the dehydration component participate in the polymerization process and are incorporated into polymeric phase. In some embodiments, isocyanates of the dehydration component participate in the polymerization process are incorporated into the polymeric phase of the organic-inorganic nanocomposite material. Moreover, in some embodiments, cross-linking agents, when present in the reaction mixture, participate in the polymerization process and provide crosslinks between polymeric chains of the polymeric phase of the organic-inorganic nanocomposite material.

A method of the present invention for producing an organic-inorganic nanocomposite material, in some embodiments, has a yield of organic-inorganic nanocomposite product greater than about 85%. In some embodiments, a method of producing an organic-inorganic nanocomposite material has a yield of organic-inorganic nanocomposite product greater than about 90%. In another embodiment, a method of producing an organic-inorganic nanocomposite material has a yield of organic-inorganic nanocomposite product greater than about 95%. In some embodiments, a method of producing an organic-inorganic nanocomposite material has a yield of organic-inorganic nanocomposite product greater than about 99%.

In another embodiment, the present invention provides methods of producing printed wire boards. In one embodiment, a method of producing a printed wire board comprises providing a substrate comprising an organic-inorganic nanocomposite material of the present invention and disposing one or a plurality of traces on the substrate.

In some embodiments, providing a substrate comprising an organic-inorganic nanocomposite material of the present invention comprises producing the organic-inorganic nanocomposite material according to any of the methods described herein. Moreover, in some embodiments, disposing one or a plurality of traces on the substrate comprises laying an electrically conductive layer over the substrate and selectively removing portions of the electrically conductive layer. Selectively removing portions of the electrically conductive layer, in some embodiments, comprises forming a pattern on the electrically conductive layer with a mask and removing portions of the electrically conductive layer not covered by the mask. Removing portions of an electrically conductive layer can be accomplished, in some embodiments, by etching or other processes operable to degrade the electrically conductive layer.

An electrically conductive layer, in some embodiments, comprises a metallic layer, such as a copper, gold, or other noble metal layer.

Some exemplary embodiments of the present invention will now be illustrated in the following specific, non-limiting examples.

DEFINITIONS

"AFM" designates Atomic Force Microscopy
"d" designates density
"FT-IR" designates Fourier Transform Infrared Spectroscopic Analysis
"DSC" designates Differential Scanning Calorimetry
"$T_g$" designates glass transition temperature
"TGA" designates Thermal Gravimetric Analysis
"$T_5$" (Delta X@5% Wt. Loss) designates temperature at which there is 5% mass loss of the heated sample during TGA test.
"Delta Y" designates the total loss of the sample, which is the content of organic phase in sample at the heating up to 700° C.
"TMA" designates Thermal Mechanical Analysis
"Ts" designates softening point
"DMA" designates Dynamic Mechanical Thermal Analysis
"CTE" designates coefficient of thermal expansion
"Dk" designates dielectric constant
"Df" designates dielectric dissipation factor
Test Methods
AFM Several small pieces of each sample were mounted on a sample holder so that a flat, horizontal surface was available to scan. Each sample retained some of the shape of the cylindrical ampoule in which the sample was formed. Therefore a cross-section of each sample was taken, and the outer surface was imaged as well as the interior of the sample. The samples were analyzed with a Digital Instruments Dimension™ 3000 Atomic Force Microscope, scanning over a 3 μm×3 μm area with the instrument probe in TappingMode™. Several sections of each sample were imaged for height, phase (differences in brittleness or elasticity), and amplitude (topography). With phase imaging, a more elastic surface had a darker appearance, while the harder areas appeared lighter or white.

Density

Density of each sample was measured by conventional Archimedean method. The sample weight in air and in deionized water was measured using ++++ digital scale to the accuracy of ++++ gram. The volume of each sample was determined respectively. The final density was computed knowing the sample weight and sample volume.

FT-IR

The samples were analyzed on a Perkin Elmer 1650 FT-IR using the DuraScope Diamond Cell ATR accessory. Spectra were collected of an inner cross-sectioned area each sample.

DSC

DSC was conducted on samples using a Perkin Elmer DSC-7. Two scan conditions were employed and are listed.

(1) Temp Ramp: −60° C. to 300° C.@ 40° C. deg/min $1^{st}$ Heat Scan
300° C. to −60° C.@ 80° C. deg/min Cooling Curve
−60° C./3 min Hold
−60° C. to 300° C.@40° C. deg/min $2^{nd}$ Heat Scan
(2) Temp Ramp: −60° C. to 300° C.@ 20° C. deg/min $1^{st}$ Heat Scan
300° C. to −60° C.@ 80° C. deg/min Cooling Curve
−60° C./3 min Hold
−60° C. to 300° C.@ 20° C. deg/min $2^{nd}$ Heat Scan Each sample (1 flat piece cut using X-ACTO knife) was approximately 3-8 mg in weight and sealed hermetically in a standard Al DSC pan. The DSC was calibrated with indium and zinc standards with the nominal nitrogen purge flow rate at 20 mls/min. The $1^{st}$ derivative was used as an aid in determining the glass transition temperatures for $1^{st}$ heat scan. The peak maximum of the $1^{st}$ derivative gives a much more precise value for Tg as compared to conventional means for low heat capacity materials. The glass transition temperature was determined (Half Cp extrapolated) for the normalized curves.

TGA

TGA was conducted on the samples using a Perkin Elmer TGA-7 run under Pyris 3.8 Revision A software for Windows. TGA produces a decomposition profile as a function of temperature. Sample sizes of 8-12 mgs (1 flat piece cut using X-ACTO knife) were taken from the center of the bulk for dispersion uniformity. Most of the samples exhibited chemical homogeneity with little or no phase separation. All of the samples were conducted under an air environment (20 mls/min) with nitrogen purge (20 mls/min). The samples were heated from 20° C. to 750° C. at 20° C./min. with a 1-minute isotherm at the end. A two-point Curie Point Temperature Calibration with Nickel and Perkalloy were performed to verify the accuracy of the TGA system.

TMA

Samples were cut from flat sheets and scanned in the TAI TMA 2940 from 25 to 320° C. at 110° C./min. The other conditions were hemispherical probe (tip diameter of 314 nm) and 0.5N static force.

DMA

Each sample was cut into rectangular strips with nominal dimensions: 30 mm length×about 4.5 mm width×thickness. The samples were mounted onto a TAI DMA 2980 in the three-point bending mode (20 mm span) and scanned at 3° C. min from 25 to 300° C. The other experimental conditions were frequency 1 Hz, 20 μm amplitude, 120% autostrain, 10 mN static force and data point collected per 4 sec.

CTE Measurement

The coefficient of thermal expansion was measured by the method of TMA. Samples were cut from flat sheets and scanned in the TAI TMA 2940 from 25 to 320° C. at 10° C./min. The other conditions were hemispherical probe (tip diameter of 314 nm) and 0.5N static force. Although the direction of the method was perpendicular to the surface of the sample (X-Y), i.e., along Z-direction, the CTE was considered as a property for the entire bulk sample because of its uniformity and isotropic nature.

Dielectric Properties Measurement

Circular disk-like samples were prepared to have 2.5 cm in diameter and 0.15 cm in thickness and optical quality of the two surfaces. Dielectric constant and dissipation factor measurements were measured as a function of frequency from 1 MHz to 1 GHz according to ASTM D150-98 "Standard Test Methods for AC Loss Characteristics and Permittivity (Dielectric Constant) of Solid Electrical Insulation."

EXAMPLE I

A solution was prepared comprising $1.1 \times 10^{-3}$ g (0.13% mole) of benzoyl peroxide (BP) and $74.50 \times 10^{-2}$ g (24.41% mole) of maleic anhydride (MAN) dissolved in the mixture of $70.35 \times 10^{-2}$ g (10.87% mole) tetraethoxysilane (TEOS) and $145.00 \times 10^{-2}$ g (64.59% mole) of acrylic acid (AA) in a glass ampoule and the ampoule was subsequently sealed in air. The inner surface of ampoule was previously hydrophobized with the treatment of the 10% solution of dichlorodimethylsilane (DCDMS) in dry decane. After agitating the reaction mixture in the vessel using a vibration table for 30 minutes at ambient temperature, the solution was heated in an oven according to the following temperature-time schedules:

40→50° C.—36 h
60° C.—15 h
80° C.—15 h
100° C.—10 h
120° C.—12 h
150° C.—1 h

The weight yield of the white non-transparent solid organic-inorganic nanocomposite product was equal to 93.5%. Physical properties of the organic-inorganic nanocomposite measured according to the test methods defined herein are provided in Table II.

TABLE II

| Properties of the Organic-Inorganic Composite Material | |
|---|---|
| Tg | 134.6° C. |
| $T_5$ | 243° C. |
| Delta Y | 89.0 wt % |

EXAMPLE II

A solution was prepared comprising $25.1 \times 10^{-3}$ g (0.32% mole) of benzoyl peroxide (BP) dissolved in the mixture of $93.79 \times 10^{-2}$ g (14.46% mole) of tetraethoxysilane (TEOS), $204.00 \times 10^{-2}$ g (42.61% mole) of methacrylic acid anhydride (MAAN) and $95.00 \times 10^{-2}$ g (42.61% mole) of acrylic acid (AA) in a glass ampoule which was sealed in air. The inner surface of ampoule was previously hydrophobized with the treatment of the solution of dichlorodimethylsilane (DCDMS) in dry decane. After agitating the reaction mixture in the vessel using a vibration table for 30 minutes at ambient temperature, the solution was heated in an oven according to the following temperature-time schedules:

40→50° C.—27 h
60° C.—18 h
80° C.—8 h
10° C.—18 h
120° C.—20 h
150° C.—1 h

The weight yield of the white non-transparent solid organic-inorganic nanocomposite product was equal to 99.7%. Physical properties of the organic-inorganic nanocomposite measured according to the test methods defined herein are provided in Table III.

TABLE III

| Properties of the Organic-Inorganic Composite Material | |
|---|---|
| Tg | 130.4° C. |
| $T_5$ | 194° C. |
| Delta Y | 93.1 wt % |
| CTE | −2.477 ppm/° C. (20-30° C.) |
| | −4.812 ppm/° C. (100-150° C.) |

EXAMPLE III

A solution was prepared comprising $15.2 \times 10^{-3}$ g (0.17% mole) of benzoyl peroxide (BP) dissolved in the mixture of $93.40 \times 10^{-2}$ g (12.59% mole) of tetraethoxysilane (TEOS), $207.32 \times 10^{-2}$ g (37.81% mole) of methacrylic acid anhydride (MAAN), $98.30 \times 10^{-2}$ g (38.35% mole) of acrylic acid (AA) and $78.15 \times 10^{-2}$ g (11.08% mole) of ethylene glycol dimethacrylate (DMEG) in a glass ampoule which was sealed in air. The inner surface of ampoule was previously hydrophobized with the treatment of the solution of dichlorodimethylsilane (DCDMS) in dry decane. After agitating the reaction mixture in the vessel using a vibration table for 30 minutes at ambient temperature, the solution was heated in an oven according to the following temperature-time schedules:

40→50° C.—75 h
60° C.—29 h
80° C.—15.5 h
10° C.—24 h
120° C.—24 h
150° C.—2 h

The weight yield of the solid non-transparent white organic-inorganic nanocomposite product was equal to 99.2%. Physical properties of the organic-inorganic nanocomposite measured according to the test methods defined herein are provided in Table IV.

TABLE IV

| Properties of the Organic-Inorganic Composite Material | |
|---|---|
| Tg | 157.8° C. |
| $T_5$ | 241° C. |
| Delta Y | 93.8 wt % |

EXAMPLE IV

A solution was prepared comprising $15.8 \times 10^{-3}$ g (0.20% mole) of benzoyl peroxide (BP) dissolved in the mixture of $93.82 \times 10^{-2}$ g (12.64% mole) of tetraethoxysilane (TEOS), 207.52 g (37.82% mole) of methacrylic acid anhydride (MAAN), 57.39×10⁻² g (18.74% mole) of methacrylic acid (MAA), 49.97×10⁻² g (19.47% mole) of acrylic acid (AA) and 78.49×10⁻² g (11.13% mole) of ethylene glycol dimethacrylate (DMEG) in a glass ampoule which was sealed in air. The inner surface of ampoule walls was previously hydrophobized with the treatment of the solution of dichlorodimethylsilane (DCDMS) in dry decane. After agitating the reaction mixture in the vessel using a vibration table for 30 minutes at ambient temperature, the solution was heated in an oven according to the following temperature-time schedules:
40→50° C.—35 h
60° C.—29 h
80° C.—15 h
100° C.—24 h
120° C.—24 h
150° C.—2 h The weight yield of the solid non-transparent white organic-inorganic nanocomposite product was equal to 99.2%. Physical properties of the organic-inorganic nanocomposite measured according to the test methods defined herein are provided in Table V.

TABLE V

| Properties of the Organic-Inorganic Composite Material | |
| --- | --- |
| Tg | 174.0° C. |
| $T_5$ | 212° C. |
| Delta Y | 93.6 wt % |

EXAMPLE V

A solution was prepared comprising 32.4×10⁻³ g (0.33% mole) of benzoyl peroxide (BP) dissolved in the mixture of 96.36×10⁻² g (11.85% mole) of tetraethoxysilane (TEOS), 6.07×10⁻¹ g (062% mole) of 3-(trimethoxysilylpropyl)methacrylate (TMSPM), 226.62×10⁻² g (37.61% mole) of methacrylic acid anhydride (MAAN), 104.42×10⁻² g (37.10% mole) of acrylic acid (AA) and 96.69×10⁻² g (12.49% mole) of ethylene glycol dimethacrylate (DMEG) in a glass ampoule which was sealed in air. The inner surface of ampoule was previously hydrophobized with the treatment of the solution of dichlorodimethylsilane (DCDMS) in dry decane. After agitating the reaction mixture in the vessel using a vibration table for 30 minutes at ambient temperature, the solution was heated in an oven according to the following temperature-time schedules:
40→50° C.—45 h
60° C.—26 h
80° C.—15 h
100° C.—24 h
120° C.—24 h
150° C.—2 h The weight yield of the white non-transparent solid organic-inorganic nanocomposite product was equal to 98.5%. Physical properties of the organic-inorganic nanocomposite measured according to the test methods defined herein are provided in Table VI.

TABLE VI

| Properties of the Organic-Inorganic Composite Material | |
| --- | --- |
| Tg | 172.8° C. |
| $T_5$ | 265° C. |
| Delta Y | 94.2 wt % |

EXAMPLE VI

A solution was prepared comprising 30.2×10⁻³ g (0.34% mole) of benzoyl peroxide (BP) dissolved in the mixture of 45.52×10⁻² g (6.20% mole) of tetraethoxysilane (TEOS), 55.10×10⁻² g (6.31% mole) of 3-(trimethoxysilylpropyl)methacrylate (TMSPM), 202.27×10⁻² g (37.32% mole) of methacrylic acid anhydride (MAAN), 94.71×10⁻² g (37.37% mole) of acrylic acid (AA) and 106.13×10⁻² g (12.46% mole) of diethylene glycol dimethacrylate (DMDEG) in a glass ampoule which was sealed in air. The inner surface of ampoule was previously hydrophobized with the treatment of the solution of dichlorodimethylsilane (DCDMS) in dry decane. After agitating the reaction mixture in the vessel using a vibration table for 30 minutes at ambient temperature, the solution was heated in an oven according to the following temperature-time schedules:
40→50° C.—28 h
60° C.—3.5 h
80° C.—4.5 h
10° C.—16 h
120° C.—24 h
150° C.—2 h The weight yield of the solid transparent organic-inorganic nanocomposite product was equal to 99.6%. Physical properties of the organic-inorganic nanocomposite measured according to the test methods defined herein are provided in Table VII.

TABLE VII

| Properties of the Organic-Inorganic Composite Material | |
| --- | --- |
| Tg | 167.0° C. |
| $T_5$ | 302° C. |
| Delta Y | 93.5% Wt. |
| Dk (10 MHz) | 4.13 |
| Df (10 MHz) | 0.0090 |

EXAMPLE VII

A solution was prepared comprising 28.5×10⁻³ g (0.37% mole) of benzoyl peroxide (BP) dissolved in the mixture of 40.55×10⁻² g (6.12% mole) of tetraethoxysilane (TEOS), 50.12×10⁻² g (6.34% mole) of 3-(trimethoxysilylpropyl)methacrylate (TMSPM), 182.99×10⁻² g (37.25% mole) of methacrylic acid anhydride (MAAN), 102.48×10⁻² g (37.34% mole) of methacrylic acid (MAA) and 97.19×10⁻² g (12.58% mole) of diethylene glycol dimethacrylate (DMDEG) in a glass ampoule which was sealed in air. The inner surface of ampoule was previously hydrophobized with the treatment of the solution of dichlorodimethylsilane (DCDMS) in dry decane. After agitating the reaction mixture in the vessel using a vibration table for 30 minutes at ambient temperature, the solution was heated in an oven according to the following temperature-time schedules:
40→50° C.—46 h
60° C.—3.5 h
80° C.—4.5 h
100° C.—16 h
120° C.—24 h
150° C.—2 h The weight yield of the transparent solid organic-inorganic nanocomposite product was equal to 99.7%. Physical properties of the organic-inorganic nanocomposite measured according to the test methods defined herein are provided in Table VIII.

TABLE VIII

Properties of the Organic-Inorganic Composite Material

| | |
|---|---|
| Tg | 170.0° C. |
| $T_5$ | 313° C. |
| Delta Y | 93.9% Wt. |
| Dk (10 MHz) | 4.99 |
| Df (10 MHz) | 0.0239 |

EXAMPLE VIII

A solution was prepared comprising $56.5 \times 10^{-3}$ g (0.36% mole) of benzoyl peroxide (BP) dissolved in the mixture of $191.65 \times 10^{-2}$ g (12.20% mole) of 3-(trimethoxysilylpropyl) methacrylate (TMSPM), $365.83 \times 10^{-2}$ g (37.47% mole) of methacrylic acid anhydride (MAAN), $204.60 \times 10^{-2}$ g (37.53% mole) of methacrylic acid (MAA) and $190.93 \times 10^{-2}$ g (12.44% mole) of diethylene glycol dimethacrylate (DMDEG) in a glass ampoule which was sealed in air. The inner surface of ampoule was previously hydrophobized with the treatment of the solution of dichlorodimethylsilane (DCDMS) in dry decane. After agitating the reaction mixture in the vessel using a vibration table for 30 minutes at ambient temperature, the solution was heated in an oven according to the following temperature-time schedules:
70° C.—1 h
80° C.—15 h
100° C.—24 h
120° C.—24 h
150° C.—2 h The weight yield of the transparent solid organic-inorganic nanocomposite product was equal to 99.3%. Physical properties of the organic-inorganic nanocomposite measured according to the test methods defined herein are provided in Table IX.

TABLE IX

Properties of the Organic-Inorganic Composite Material

| | |
|---|---|
| Tg | 187.0° C. |
| $T_5$ | 269° C. |
| Delta Y | 95.2 wt % |
| Dk (10 MHz) | 3.60 |
| Df (10 MHz) | 0.0170 |

EXAMPLE IX

A solution was prepared comprising $191.82 \times 10^{-2}$ g (17.20% mole) of titanium isopropoxide (TIPO) dissolved in the mixture of $213.75 \times 10^{-2}$ g (35.30% mole) of methacrylic acid anhydride (MAAN), $100.02 \times 10^{-2}$ g (35.35% mole) of acrylic acid (AA) and $91.97 \times 10^{-2}$ (11.82% mole) of diethylene glycol dimethacrylate (DMDEG) in a glass ampoule which was sealed in air. The inner surface of ampoule was previously hydrophobized with the treatment of the 10% solution of DCDMS in dry decane. After agitating the reaction mixture in the vessel using a vibration table for 30 minutes at the temperature 35-40° C., $30.50 \times 10^{-3}$ g (0.33% mole) of BP was added to the solution and the ampoule was subsequently sealed in air. Then the ampoule was heated in an oven according to the following temperature-time schedules:
40→50° C.—24 h
60° C.—9 h
80° C.—15 h
100° C.—10 h
120° C.—14 h
135° C.—2 h The weight yield of the transparent solid organic-inorganic nanocomposite product was equal to 94.0%. Physical properties of the organic-inorganic nanocomposite measured according to the test methods defined herein are provided in Table X.

TABLE X

Properties of the Organic-Inorganic Composite Material

| | |
|---|---|
| Tg | 225° C. |
| $T_5$ | 265° C. |
| Delta Y | 88.4 wt % |

EXAMPLE X

A solution was prepared comprising $29.6 \times 10^{-3}$ g (0.31% mole) of benzoyl peroxide (BP) dissolved in the mixture of $97.71 \times 10^{-2}$ g (8.79% mole) of titanium isopropoxide (TIPO), $85.65 \times 10^{-2}$ g (8.82% mole) of 3-(trimethoxysilylpropyl) methacrylate (TMSPM), $208.13 \times 10^{-2}$ g (34.51% mole) of methacrylic acid anhydride (MAAN), $99.05 \times 10^{-2}$ g (35.15% mole) of acrylic acid (AA) and $92.84 \times 10^{-2}$ g (12.42% mole) of ethylene glycol dimethacrylate (DMEG) in a glass ampoule which was sealed in air. The inner surface of ampoule was previously hydrophobized with the treatment of the solution of dichlorodimethylsilane (DCDMS) in dry decane. After agitating the reaction mixture in the vessel using a vibration table for 30 minutes at ambient temperature, the solution was heated in an oven according to the following temperature-time schedules:
40→50° C.—24 h
60° C.—9 h
80° C.—15 h
100° C.—10 h
120° C.—14 h
135° C.—2 h The weight yield of the transparent solid organic-inorganic nanocomposite product was equal to 97.4%. Physical properties of the organic-inorganic nanocomposite measured according to the test methods defined herein are provided in Table XI.

TABLE XI

Properties of the Organic-Inorganic Composite Material

| | |
|---|---|
| Tg | 216° C. |
| $T_5$ | 259° C. |
| Delta Y | 90.2 wt % |

EXAMPLE XI

A solution was prepared comprising $31.7 \times 10^{-3}$ g (0.33% mole) of benzoyl peroxide (BP) dissolved in the mixture of $95.82 \times 10^{-2}$ g (8.67% mole) of titanium isopropoxide (TIPO), $84.77 \times 10^{-2}$ g (8.77% mole) of 3-(trimethoxysilylpropyl) methacrylate (TMSPM), $207.27 \times 10^{-2}$ g (34.58% mole) of methacrylic acid anhydride (MAAN), $120.40 \times 10^{-2}$ g (36.00% mole) of methacrylic acid (MAA) and $109.75 \times 10^{-2}$ g (11.65% mole) of diethylene glycol dimethacrylate (DMDEG) in a glass ampoule which was sealed in air. The inner surface of ampoule was previously hydrophobized with the treatment of the solution of dichlorodimethylsilane (DCDMS) in dry decane. After agitating the reaction mixture in the vessel using a vibration table for 30 minutes at ambient temperature, the solution was heated in an oven according to the following temperature-time schedules:

40→50° C.—24 h
60° C.—9 h
80° C.—15 h
100° C.—10 h
120° C.—14 h
135° C.—2 h

The weight yield of the transparent solid organic-inorganic nanocomposite product was equal to 97.9%. Physical properties of the organic-inorganic nanocomposite measured according to the test methods defined herein are provided in Table XII.

TABLE XII

| Properties of the Organic-Inorganic Composite Material | |
| --- | --- |
| Tg | 225° C. |
| $T_5$ | 240° C. |
| Delta Y | 91.0 wt % |

Organic-inorganic composite materials of the present invention can demonstrate advantageous properties, such as no shrinking, or substantially no shrinking, upon drying. The non-shrinking properties of some embodiments of organic-inorganic nanocomposite materials of the present invention can preclude or inhibit compressive and tensional stresses within the nanocomposite materials, which can lead to cracking and other degradative pathways. In some embodiments, dry stability and resistance to degradative pathways can permit the production of organic-inorganic nanocomposite materials having desirable physical dimensions, particularly when compared with prior sol-gel processed composite materials. Some embodiments of organic-inorganic nanocomposite materials of the present invention can find application in a wide variety of fields, including the electronics industry. Some embodiments of organic-inorganic nanocomposite materials, for example, can find application as a substrate for printed wire board applications.

Moreover, methods of producing organic-inorganic nanocomposite materials, according to some embodiments of the present invention, can offer several advantages over prior synthetic routes. Some methods of the present invention, for example, provide for the "one-pot" synthesis of organic-inorganic nanocomposite materials from a single reaction mixture. Some methods of the present invention for producing an organic-inorganic nanocomposite material can effectively consume water generated in the polycondensation of metal oxides in the formation of an inorganic metal oxide matrix. The consumption of water formed from the polycondensation reaction according to some embodiments of the present invention reduces the amount of free water in the resulting organic-inorganic nanocomposite, which can thereby reduce effects of shrinkage on the organic-inorganic nanocomposite during drying processes in some embodiments. Some embodiments of methods of the present invention can display high product yields. Some embodiments of methods of the present invention do not require reagents of limited availability or additional solvents or cosolvents, such as water, polar solvents, or organic solvents. As a result, according to some embodiments of methods of the present invention, a wide variety of metal alkoxides, organic monomers, and/or organic prepolymers can be used in the synthesis of organic-inorganic nanocomposite materials of the present invention.

Various embodiments of the invention have been described in fulfillment of the various objectives of the invention. It should be recognized that these embodiments are merely illustrative of the principles of the present invention. Numerous modifications and adaptations thereof will be readily apparent to those skilled in the art without departing from the spirit and scope of the invention.

That which is claimed is:

1. A organic-inorganic nanocomposite material comprising an inorganic metal oxide matrix interpenetrating with an organic polymeric phase, the inorganic metal oxide matrix and the organic polymeric phase comprising products of a reaction mixture comprising:
   a) a metal alkoxide component of the formula

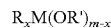

wherein M is a metal;
   wherein R is selected from the group consisting of -alkyl, -alkoxy, -acryl, -methacryl, -alkenyl, -cycloalkyl, -heterocyclyl, -aryl, -heteroaryl, -alkylene-cycloalkyl, -cycloalkylene-alkyl, -alkylene-aryl, -alkylene-heteroaryl, -arylene-alkyl, -heteroarylene-alkyl, -alkylene-acryl, and -alkylene-methacryl;
   wherein R' is -alkyl; and
   wherein x is 1, 2 or 3 and m is 3 or 4;
      (b) an unsaturated organic acid component;
      (c) a dehydration component comprising an anhydride of an unsaturated organic acid; and
      (d) a free radical initiator component;
   wherein the organic-inorganic nanocomposite material is solid and comprises greater than about 85% by weight of the reaction mixture.

2. The organic-inorganic nanocomposite material of claim 1, wherein R is selected from the group consisting of methoxy, ethoxy, butoxy, and isopropoxy.

3. The inorganic nanocomposite material of claim 1, wherein R is methacryloxypropyl.

4. The inorganic nanocomposite material of claim 1, wherein R is styrylethyl.

5. The organic-inorganic nanocomposite material of claim 1, wherein the metal alkoxide component comprises tetramethoxysilane (TMOS), tetraethoxysilane (TEOS), 3-(trimethoxysilyl)propyl methacrylate (TMSPM), triethoxyvinylsilane (TEVS), styrylethyltrimethoxysilane (SEMS), titanium ethoxide (TEO), titanium isopropoxide (TIPO), aluminum triethoxide (ATO), aluminum isopropoxide (TIPO), zirconium ethoxide (ZEO), or mixtures thereof.

6. The organic-inorganic nanocomposite material of claim 1, wherein M is selected from the group consisting of silicon, aluminum, titanium, and zirconium.

7. The organic-inorganic nanocomposite material of claim 1, wherein the metal alkoxide component is present in the reaction mixture in an amount up to about 40 weight percent.

8. The organic-inorganic nanocomposite material of claim 1, wherein the metal alkoxide component is present in the reaction mixture in an amount up to about 30 weight percent.

9. The organic-inorganic nanocomposite material of claim 1, wherein the unsaturated organic acid component comprises at least one unsaturated organic acid of the formula

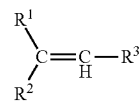

wherein $R^1$, $R^2$, and $R^3$ are independently selected from the group consisting of -hydrogen, -alkyl, and -carboxyl.

10. The organic-inorganic nanocomposite material of claim 1, wherein unsaturated organic acid component comprises acrylic acid, methacrylic acid, crotonic acid, itaconic acid, maleic acid, or mixtures thereof.

11. The organic-inorganic nanocomposite material of claim 1, wherein the unsaturated organic acid component is present in the reaction mixture in an amount up to about 70 weight percent.

12. The organic-inorganic nanocomposite material of claim 1, wherein the unsaturated organic acid component is present in the reaction mixture in an amount up to about 60 weight percent.

13. The organic-inorganic nanocomposite material of claim 1, wherein the unsaturated organic acid component is present in the reaction mixture in an amount up to about 40 weight percent.

14. The organic-inorganic nanocomposite material of claim 1, wherein the anhydride of the unsaturated organic acid has the formula $$C_xH_yO_3$$

wherein x is an integer from 4 to 8 and y is an integer from 2 to 10.

15. The organic-inorganic nanocomposite material of claim 1, wherein the dehydration component comprises acrylic anhydride, methacrylic anhydride, itaconic anhydride, maleic anhydride, or mixtures thereof.

16. The organic-inorganic nanocomposite of claim 1, wherein the dehydration component comprises at least one isocyanate of the formula $$R^4-N=C=O$$

wherein $R^4$ is selected from the group consisting of acryl-alkyl, methacryl-alkyl, alkenyl, and alkenylene-alkyl.

17. The organic-inorganic nanocomposite of claim 1, wherein the dehydration component comprises 2-isocyanatoethyl methacrylate (ICEM).

18. The organic-inorganic nanocomposite material of claim 1, wherein the dehydration component is present in the reaction mixture in an amount up to about 60 weight percent.

19. The organic-inorganic nanocomposite material of claim 1, wherein the dehydration component is present in the reaction mixture in an amount up to about 45 weight percent.

20. The organic-inorganic nanocomposite material of claim 1, wherein the reaction mixture further comprises a cross-linking component.

21. The organic-inorganic nanocomposite material of claim 1, wherein the reaction mixture further comprises at least one additional monomer or prepolymer.

22. The organic-inorganic nanocomposite material of claim 1, wherein the inorganic metal oxide matrix is covalently bonded to the polymeric phase.

23. The organic-inorganic nanocomposite material of claim 1, wherein the organic-inorganic nanocomposite material is non-transparent.

24. The organic-inorganic nanocomposite material of claim 1, wherein the organic-inorganic nanocomposite material is transparent.

25. A printed wire board comprising:
a substrate comprising the organic-inorganic nanocomposite material of claim 1.

26. The printed wire board of claim 25 further comprises at least one trace.

* * * * *